(12) United States Patent
Copeland

(10) Patent No.: US 6,180,883 B1
(45) Date of Patent: Jan. 30, 2001

(54) CAST IN SITU RETENTION FEATURES FOR A PRESS FIT ASSEMBLY

(75) Inventor: Kevin Allen Copeland, Greenwood, IN (US)

(73) Assignee: General Motors Corporation, Detroit, MI (US)

( * ) Notice: Under 35 U.S.C. 154(b), the term of this patent shall be extended for 0 days.

(21) Appl. No.: 09/246,518

(22) Filed: Feb. 8, 1999

(51) Int. Cl.⁷ ....................................... H02G 3/18
(52) U.S. Cl. ................ 174/65 G; 220/3.92; 174/152 G; 174/153 G
(58) Field of Search ................ 174/65 G, 151, 174/50, 152 G, 153 G; 248/56; 16/2.1, 2.2; 220/3.92, 3.94, 4.02

(56) References Cited

U.S. PATENT DOCUMENTS

| | | | |
|---|---|---|---|
| 3,288,910 | * 11/1966 | Zerwes | 174/53 |
| 3,937,352 | * 2/1976 | Kalous | 220/3.94 |
| 4,390,114 | * 6/1983 | Sviatoslavsky et al. | 220/337 |
| 5,740,936 | * 4/1998 | Nash | 220/3.92 X |
| 5,848,718 | * 12/1998 | Colwell | 220/4.02 |

* cited by examiner

Primary Examiner—Dean A. Reichard
(74) Attorney, Agent, or Firm—Laura C. Hargitt

(57) ABSTRACT

A die cast housing has an aperture with cast in situ lips adjacent upper and lower surfaces. A pair of deformable grommets are inserted in the aperture and compressed by applying a force to a pair of bushings disposed in the grommets. The grommets flow under the compression force to fill the aperture under the lips and are thereby retained in the aperture. This provides the housing with an isolator assembly such that the housing can be mounted to a frame while being electrically isolated therefrom.

5 Claims, 4 Drawing Sheets

CAST IN SITU RETENTION FEATURES FOR A PRESS FIT ASSEMBLY

TECHNICAL FIELD

This invention relates to press fit assemblies and more particularly to retention features in a housing to which a deformable member is press fit.

BACKGROUND OF THE INVENTION

In many assemblies, a metal housing is secured to a frame by metal fasteners. The housing is preferably isolated electrically and/or vibrationally from the frame and the fasteners. To this end, the mounting member or isolator is a deformable polymer, such as nylon. Since it is desired to install the isolators when the housing is assembled and prior to attachment with the frame, a method of securing the isolators in apertures in the housing is required. To date this has been accomplished by machining the apertures to form an undercut or other irregular surface. It is also possible to install fasteners in the isolators when the housing is assembled, however this adds to the shipping weight and assembly cost; and the fasteners must be removed prior to installation on the frame which further adds to the overall product cost.

SUMMARY OF THE INVENTION

It is an object of the present invention to provide an improved assembly feature for securing a deformable isolator in an aperture.

In one aspect of the present invention, a cast housing is provided with a step or lip adjacent an outer surface of the housing. In another aspect of the present invention, the aperture is formed during casting by using die pins which are pulled in opposite directions. In a further aspect of the present invention, each die pin forms a pair of diametrically opposed quarter round lips.

In yet another aspect of the present invention, one die pin forms the lips at an upper surface of the housing and the other die pin forms the lips at a lower surface. In still another aspect of the present invention, an isolator incorporates two deformable nylon grommet members which are pressed in the aperture such that the outer surface of each grommet conforms to the inner surface of the aperture and the grommets are retained therein by respective ones of the lips.

DESCRIPTION OF AN EXEMPLARY EMBODIMENT

Figure 1:
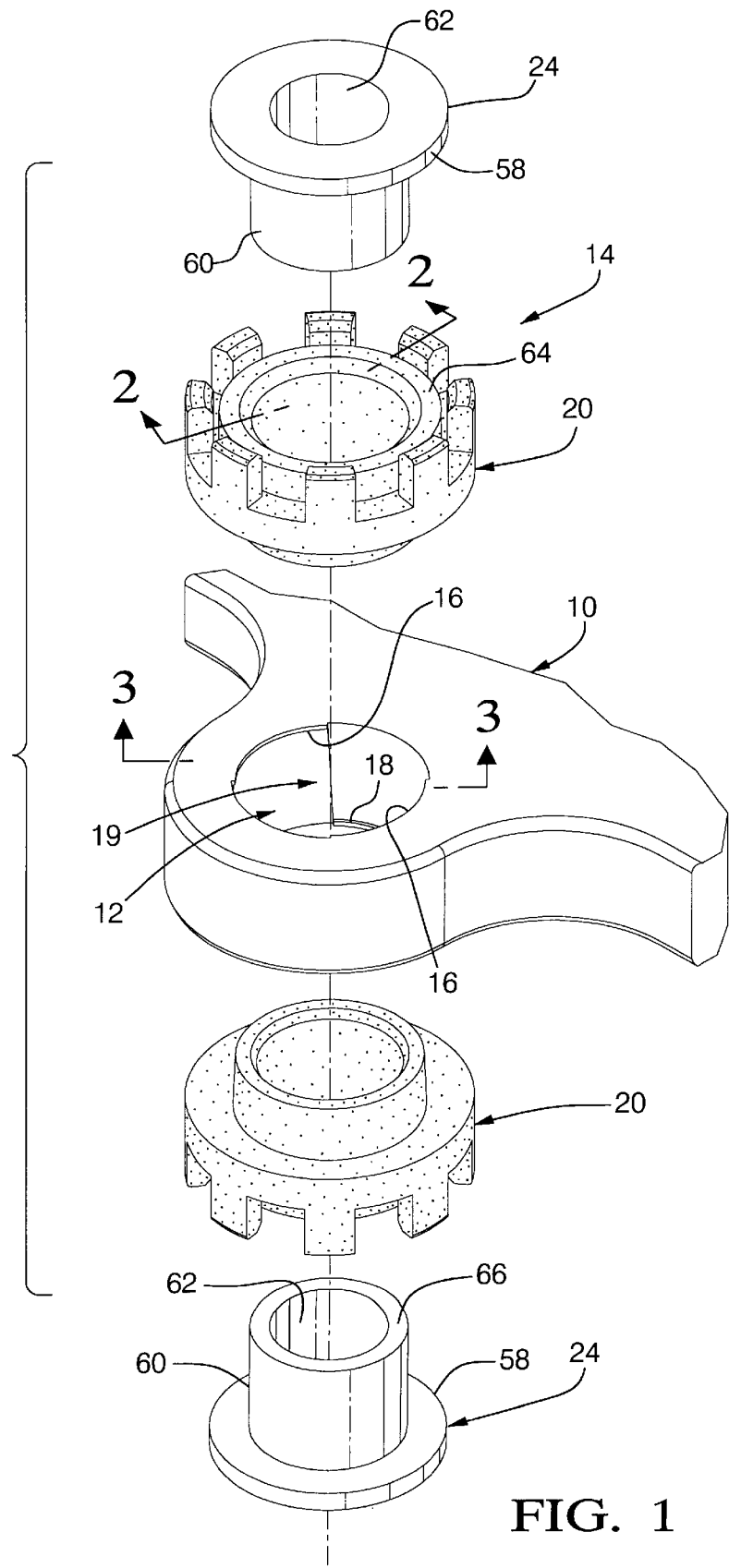
FIG. 1 is an exploded view of a portion of a housing and an isolator assembly incorporating the present invention.
Figure 2:
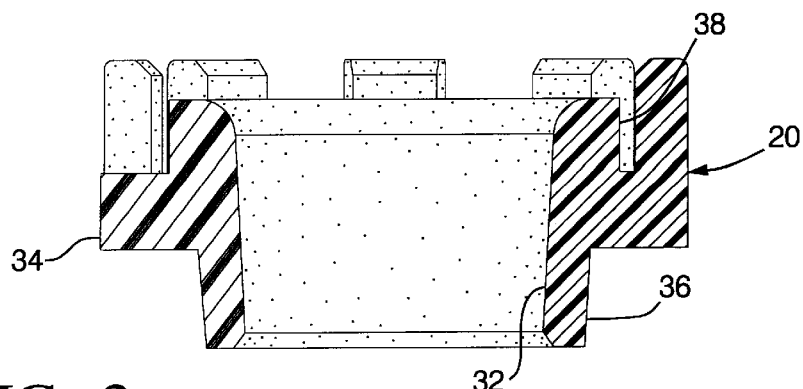
FIG. 2 is a sectional view taken along line 2—2 in FIG. 1 depicting the grommet used with the isolator assembly.
Figure 3:
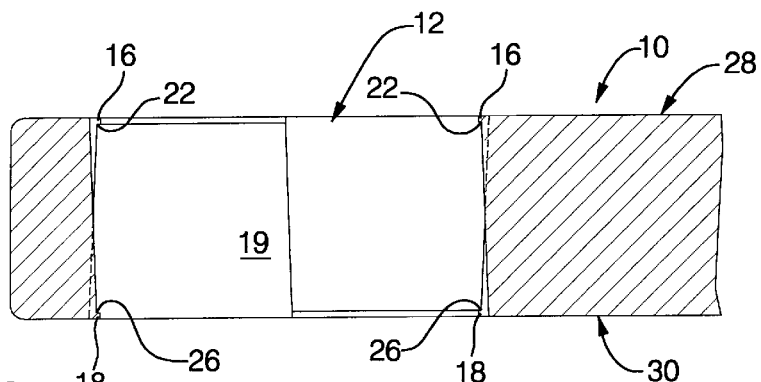
FIG. 3 is a sectional view taken along line 3—3 in FIG. 1 describing the cast in situ aperture in the housing.
Figure 4:
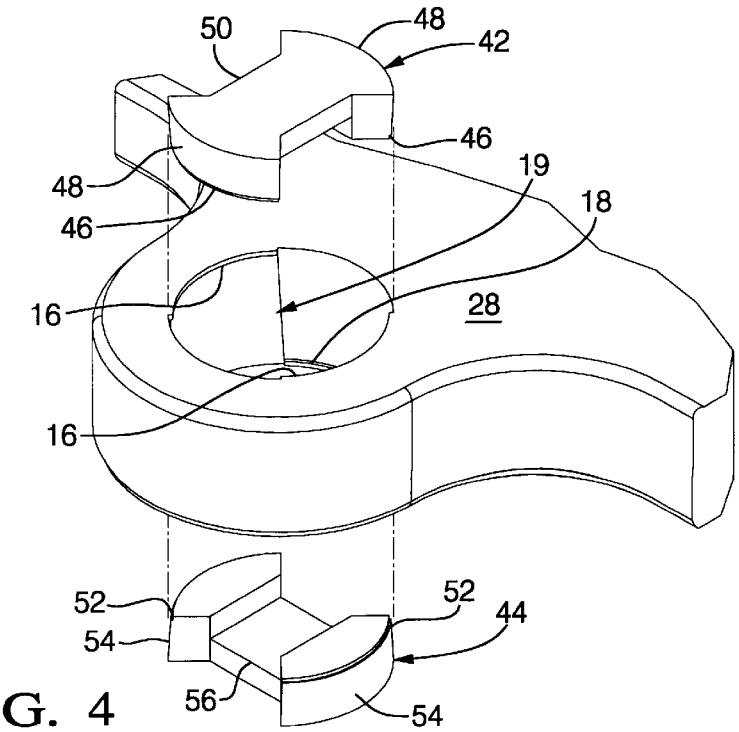
FIG. 4 is an exploded view showing the die pins being extracted from an aperture in the housing.

A housing 10, made of cast or molded aluminum using a die casting or injection process, has a cast in situ mounting aperture 12 in which a bushing and grommet assembly 14 is secured. The aperture has a pair of diametrically opposed upper retaining lips 16 and a pair of diametrically opposed lower retaining lips 18. Each pair of lips 16 and 18 present ledges 22 and 26 respectively to the interior of the aperture 12. The aperture 12 has a substantially cylindrical central portion 19. As best seen in FIGS. 1 and 4, the lips 16 and the lips 18 are off set circumferentially from each other.

The bushing and grommet assembly 14 includes a pair of grommets 20 and a pair of bushings 24. One grommet 20 and one bushing 24 are inserted into the aperture 12 at a top surface 28 and the other grommet 20 and the other bushing 24 are inserted into the aperture at a lower surface 30. Each grommet 20 has a central opening 32 and a central ledge or rim 34. A lower cylindrical wall 36 and a upper cylindrical wall 38 extend from the ledge 34.

The lips 16 and 18 and the central portion 19 are formed in the casting process during which a pair of core pins 42, 44 are inserted into the die. As is well known, the core pins 42, 44 must be pulled from the die prior to the die being opened before the die cast product, the housing 10, is removed. (The core pins can be rigidly attached to the two die halves and pulled with the die halves. The pin 42 has shelf portions 46, which form the lips 18, and a pair of diametrically opposed arcuate surfaces 48 joined by a central step 50. The step 50 has approximately one-half the thickness of the arcuate surfaces 48.

The pin 44 has shelf portions 52, which form the lips 16, and a pair of diametrically opposed arcuate surfaces 54 joined by a central step 56. The step 56 has approximately one-half the thickness of the arcuate surfaces 54. When the pins 42 and 44 are inserted into the die, the arcuate surfaces 48 and 54 intermesh to form a substantially cylindrical core for the aperture 12. During the die casting operation, the metal flows around the pins 42, 44 to form the aperture 12 with the lips 16 and 18 being formed by the respective shelf portions 46 and 52.

The bushings 24 are shaped like a top hat having a rim 58 and an upstanding cylindrical portion 60. The bushings have a central opening 62. The rim 58 is disposed in abutting relation with an annular wall 64 on the grommet 20 and the upstanding portion 60 is inserted into the central opening 32. Each upstanding portion 60 has a flat, annular end wall 66.

Figure 5:
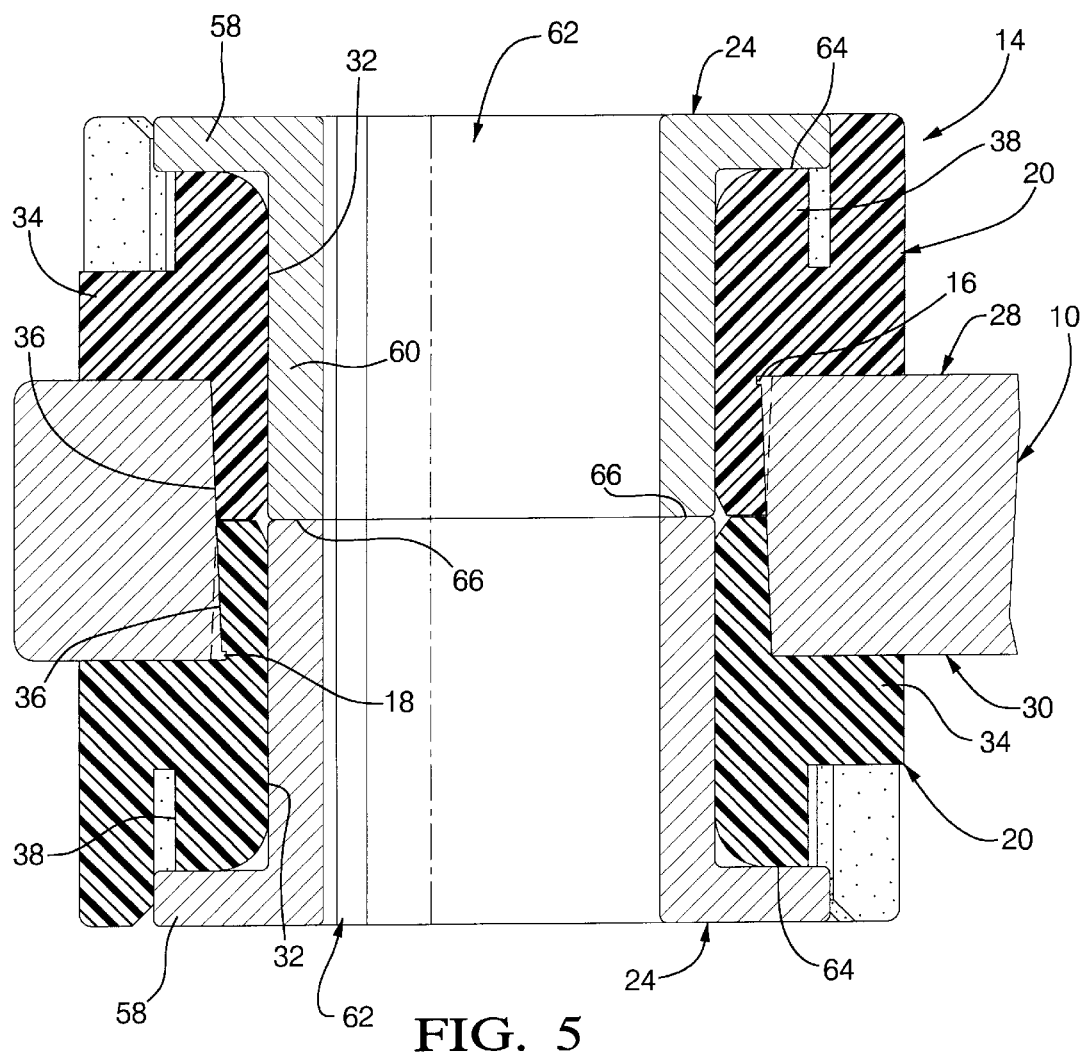
FIG. 5 is an elevational view in section showing a grommet isolator assembly in a housing-incorporating the present invention.

The grommets 20 are preferably made of nylon or rubber and the bushings 24 are preferably steel. The grommets 20 are inserted into the aperture 12 from opposite sides as shown in FIGS. 1 and 5. The bushings 24 are then inserted into the grommets 20. The bushings 24 are pressed into the grommets 20 with sufficient force to cause the grommet material to flow and fill the aperture 12.

As seen in FIG. 5, the grommets 20 will also flow under the lips 16 and 18. This will secure the grommets in the aperture 12. The bushings are pressed into the grommets until the end walls 66 are in abutment. After completion of this assembly process, the housings can be transported to other work stations or to the final assembly or stored for service use later without the grommets becoming dislodged. When the housing is installed in the finished product, such as a motor vehicle, the bushing assembly 14 will provide both electrical isolation and vibratory isolation of the housing and the frame on which it is mounted.

Figure 6:
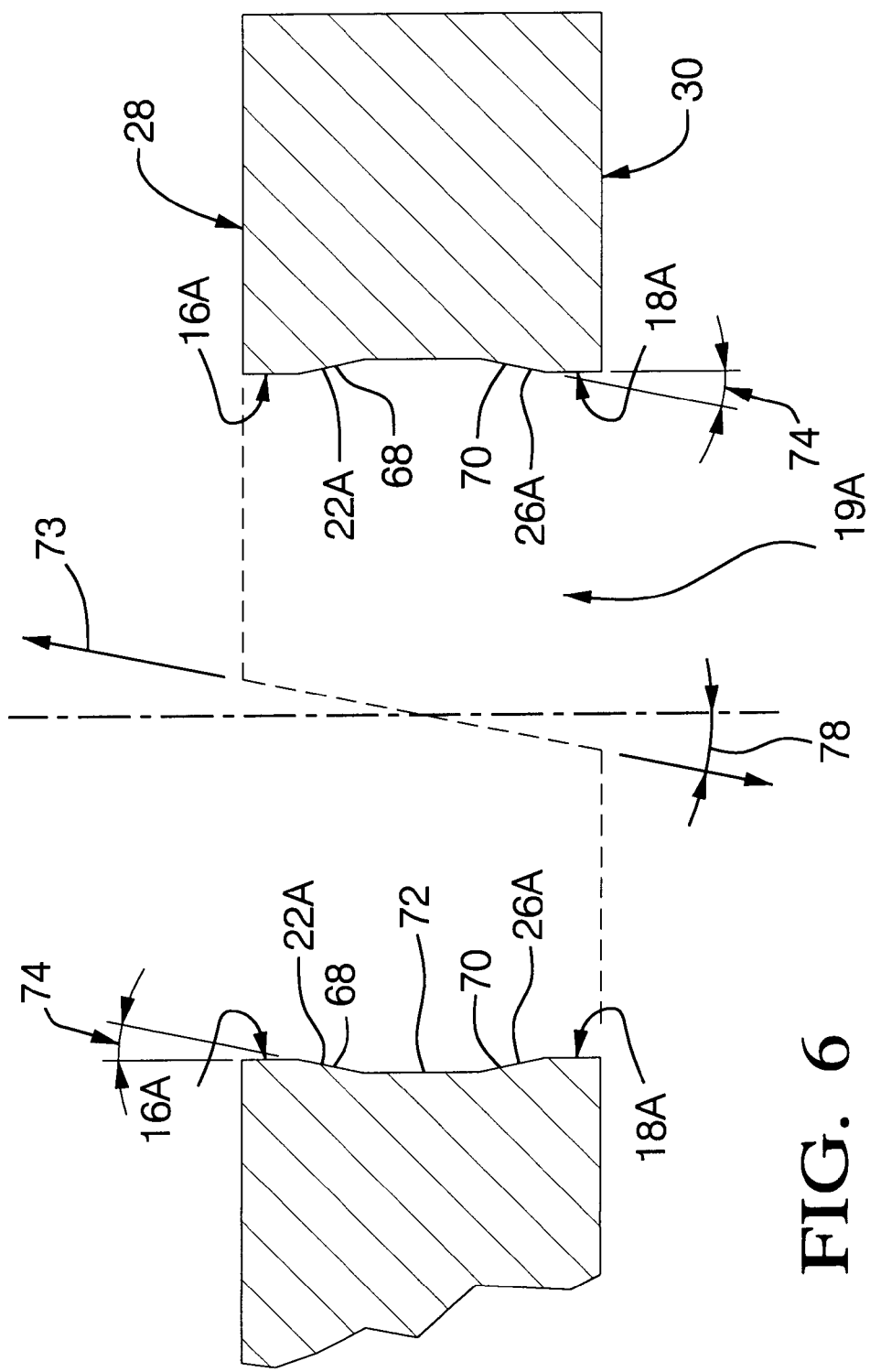
FIG. 6 is a side elevation sectional view of an alternative cast in situ aperture in the housing.

As seen in FIG. 6, lips 16A and 18A can also be cast in situ and have angular surfaces 68 and 70 respectively which diverge from the wall 72 of the cylindrical portion 19A to form angular ledges 22A and 26A respectively. The formation of angular ledges is possible through the use of angularly pulled core pins, not shown, which are retracted or pulled from the die along the axis of line 73. The angle of divergence 74 will be substantially equal to the die pull angle 76 of retraction for the core pins. For example, if the core pins have a die pull angle of eleven and one-half degrees, the lips will have a diverging angle of eleven and one-half degrees. With this casting process, one of the lips 16A and one of the lips 18A are formed by one core pin while the other lip 16A and the other lip 18A are formed by the other core pin. The lips 16A which are cast in situ adjacent the upper surface 28 will be diametrically opposed as will the lips 18A which are cast in situ adjacent the lower surface 30, however the lips 16A will be axially aligned with respective ones of the lips 18A.

What is claimed is:

1. A housing and isolator assembly comprising:

a housing having upper and lower surfaces, an aperture cast in the housing having a first pair of diametrically opposed cast in situ lip portions adjacent said upper surface and a second pair of diametrically opposed cast in situ lip portions adjacent said lower surface; and deformable grommet means for providing isolation disposed in said aperture and being deformed to engage a surface on said first and second lip portions internally of said aperture to effect retention of said grommet means in said aperture.

2. The housing and isolator assembly defined in claim 1 further comprising:

each lip of said first pair of lip portions forming a quarter circle ledge;

each lip of said second pair of lip portions forming a quarter circle ledge circumferentially off set from respective ones of said lip portions of said first pair of lip portions.

3. The housing and isolator assembly defined in claim 1 further comprising:

said aperture having a substantially cylindrical wall between said first pair of lip portions and said second pair of lip portions;

each of said lip portions having a diverging portion intersecting said cylindrical wall.

4. The housing and isolator assembly defined in claim 3 further wherein, each lip portion of said first pair of lip portions being axially aligned with respective ones of each lip portion of said second pair of lip portions.

5. The housing and isolator assembly defined in claim 1 further comprising:

a first bushing disposed in a central opening in said grommet means and having a rim section abutting a top annular wall of said grommet means and an annular end wall; and a second bushing disposed in a central opening in said grommet means and having a rim section abutting a top annular wall of said grommet means and an annular end wall disposed in abutment with said annular end wall of said first bushing.

\* \* \* \* \*